United States Patent
Ogawa

(10) Patent No.: US 7,872,312 B2
(45) Date of Patent: Jan. 18, 2011

(54) SEMICONDUCTOR DEVICE COMPRISING A HIGH DIELECTRIC CONSTANT INSULATING FILM INCLUDING NITROGEN

(75) Inventor: Hisashi Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 212 days.

(21) Appl. No.: 12/172,680

(22) Filed: Jul. 14, 2008

(65) Prior Publication Data

US 2009/0039437 A1   Feb. 12, 2009

(30) Foreign Application Priority Data

Aug. 10, 2007   (JP)   ............................. 2007-209343

(51) Int. Cl.
*H01L 29/76* (2006.01)
(52) U.S. Cl. .................. 257/369; 257/331; 257/371; 257/E21.191; 438/241; 438/199; 438/230
(58) Field of Classification Search ............ 257/295, 257/369, 405–407, 249, 314–320, 331, 336, 257/387
See application file for complete search history.

(56) References Cited

U.S. PATENT DOCUMENTS

| 7,435,651 | B2 * | 10/2008 | Varghese et al. | ............ 438/275 |
| 7,579,660 | B2 * | 8/2009 | Akiyama et al. | ............ 257/407 |
| 2002/0037615 | A1 | 3/2002 | Matsuo | |
| 2002/0135030 | A1 | 9/2002 | Horikawa | |
| 2007/0063273 | A1 * | 3/2007 | Yoneda | ........................ 257/333 |
| 2007/0090427 | A1 | 4/2007 | Nakajima | |
| 2007/0278558 | A1 * | 12/2007 | Koyama et al. | ............. 257/315 |

OTHER PUBLICATIONS

Hayashi, T., et al., "Cost Worthy and High Performance LSTP CMIS; Poly-Si/HfSiON nMIS and Poly-Si/TiN/HfSiON pMIS", IEDM Tech. Dig., 2006, pp. 247-250, IEEE.

* cited by examiner

*Primary Examiner*—Dung A. Le
(74) *Attorney, Agent, or Firm*—McDermott Will & Emery LLP

(57) ABSTRACT

A semiconductor device includes a first gate electrode formed in a first region on a semiconductor substrate with a first gate insulating film sandwiched therebetween; and a second gate electrode formed in a second region on the semiconductor substrate with a second gate insulating film sandwiched therebetween. The first gate insulating film includes a first high dielectric constant insulating film with a first nitrogen concentration and the second gate insulating film includes a second high dielectric constant insulating film with a second nitrogen concentration higher than the first nitrogen concentration.

20 Claims, 11 Drawing Sheets

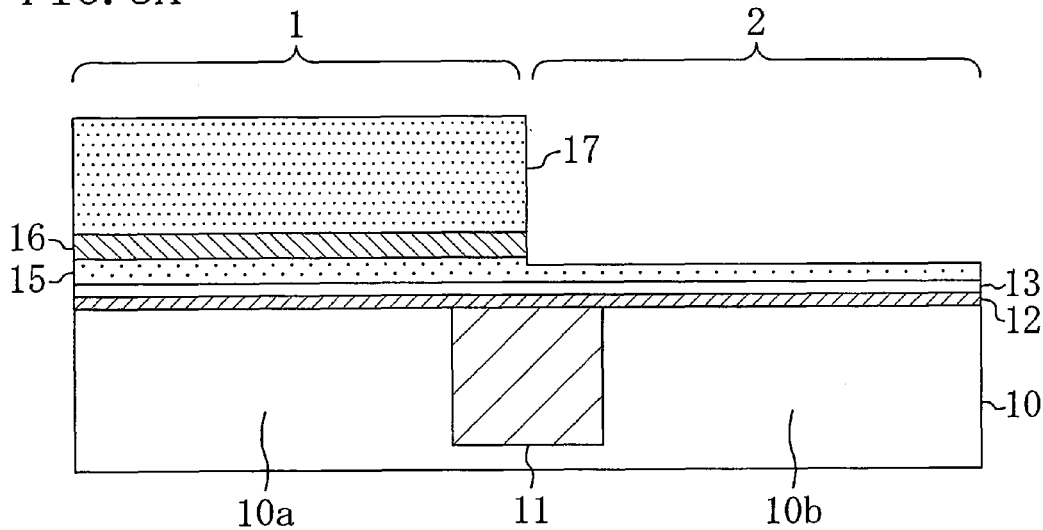
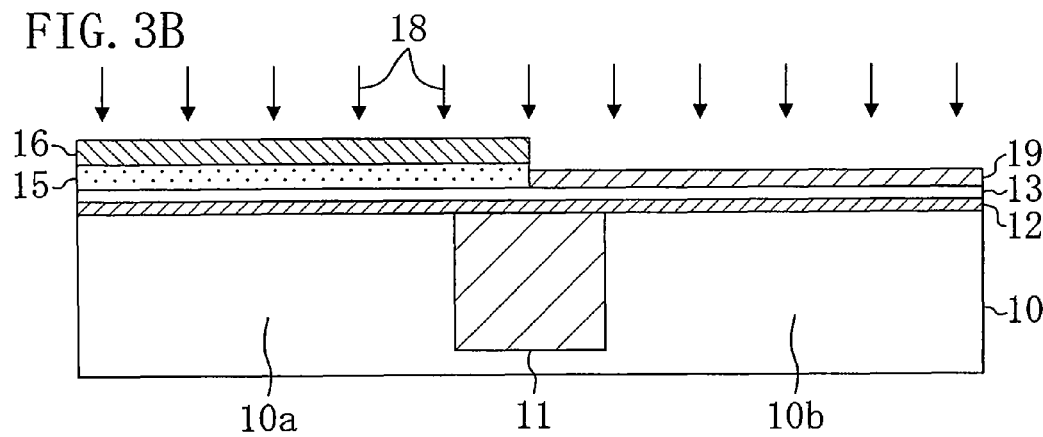
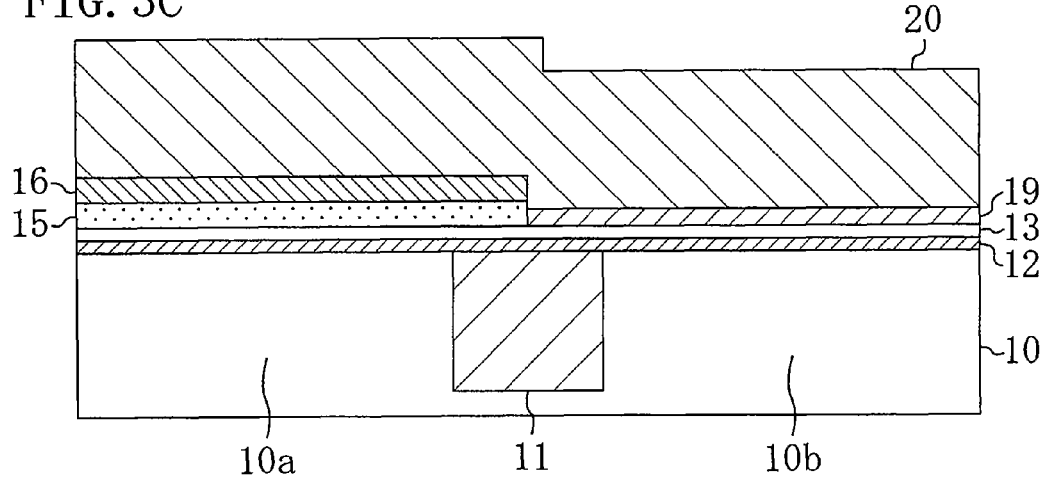

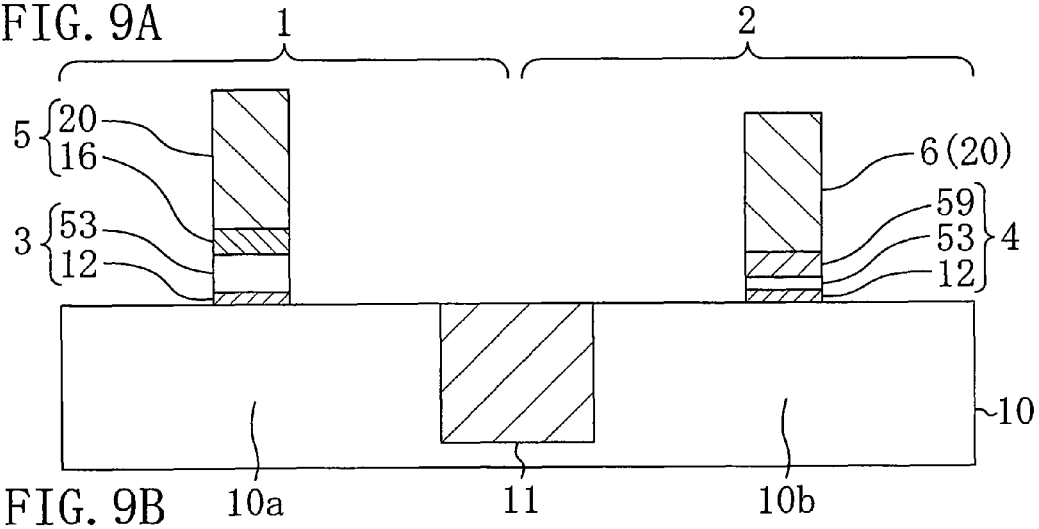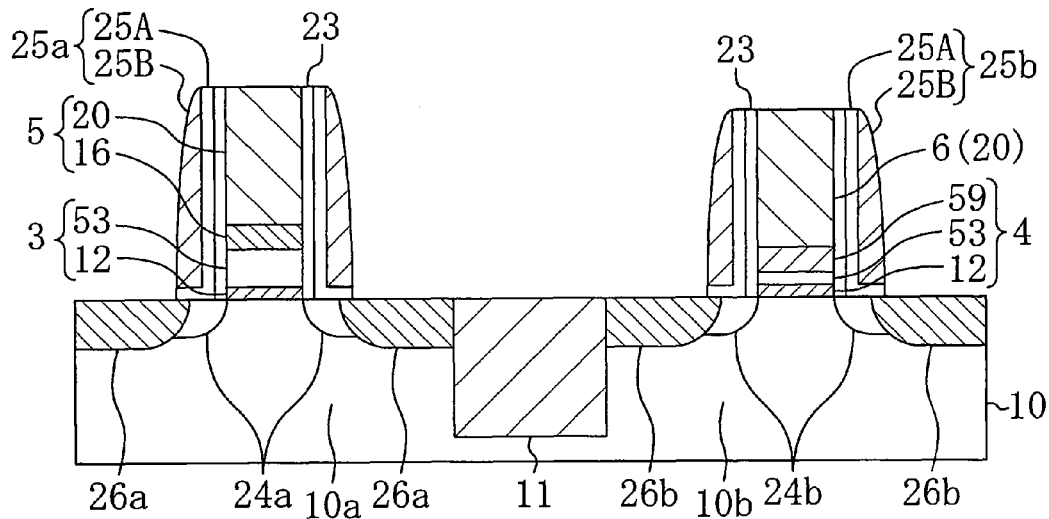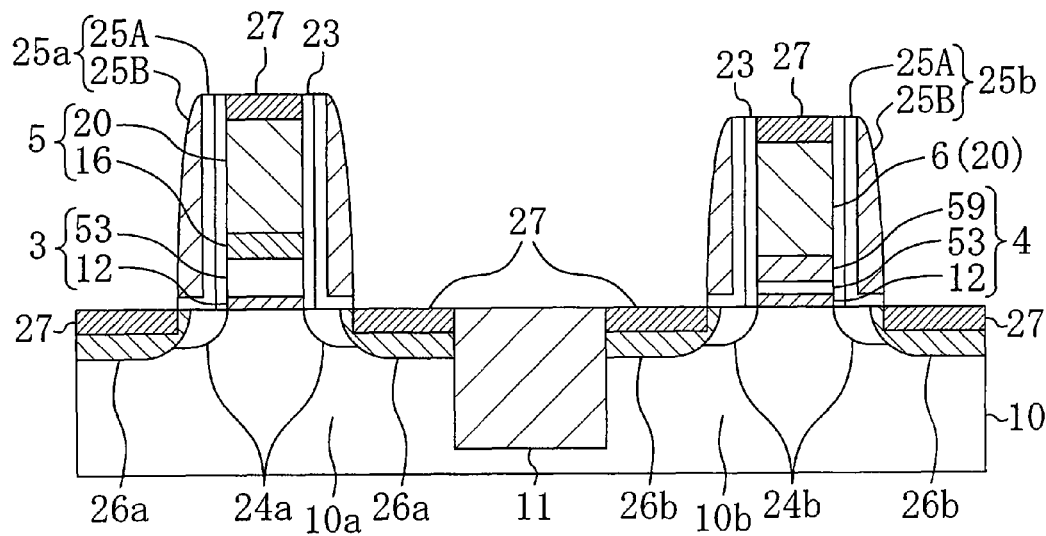

SEMICONDUCTOR DEVICE COMPRISING A HIGH DIELECTRIC CONSTANT INSULATING FILM INCLUDING NITROGEN

BACKGROUND OF THE INVENTION

The present invention relates to a semiconductor device and a method for fabricating the same, and more particularly, it relates to a semiconductor device including a high dielectric constant film as a gate insulating film and a method for fabricating the same.

In a CMOS (complementary metal-oxide semiconductor) device having been developed to be more and more refined, when a conventionally used gate insulating film made of a silicon oxide film or the like is reduced in the thickness, the leakage current is increased so as to increase the standby current of an LSI (large scale integration) circuit including the device. Therefore, the thickness of a gate insulating film made of a silicon oxide film or the like has been reduced to its limit. Accordingly, examinations are now being earnestly made for application to a gate insulating film of a high dielectric constant film, which can attain a small electric thickness even when the physical thickness is large. Currently, HfSiON is regarded as the most promising material for a high dielectric constant film used as a gate insulating film. Also, in a polysilicon electrode conventionally used as a gate electrode, it has become impossible to ignore the depletion, and hence, a metal gate electrode free from depletion is now being earnestly studied.

As CMOS process using such a HfSiON gate insulating film and a metal gate electrode, use of a polysilicon electrode in an N-type MOSFET (metal-oxide-semiconductor field-effect transistor) and a TiN metal electrode in a P-type MOSFET has been proposed as described in Non-patent Document 1 (T. Hayashi, et al., Cost Worthy and High Performance LSTP CMIS: Poly-Si/HfSiON nMIS and Poly-Si/TiN/HfSiON pMIS, IEDM Tech. Dig., 2006, pp. 247-250).

A method for fabricating this conventional semiconductor device will now be described with reference to cross-sectional views of FIGS. 11A through 11C showing respective procedures in the method.

First, as shown in FIG. 11A, an isolation region 111 is formed in a semiconductor substrate 110 so as to isolate a P-type MOSFET region 101 and an N-type MOSFET region 102. Then, an interface layer 112 of SiON and a HfSiO film 113 are successively formed on the semiconductor substrate 110. Thereafter, the HfSiO film 113 is nitrided so as to form a HfSiON modified layer 115, and subsequently, a TiN film 116 is formed on the HfSiON modified layer 115 by CVD (chemical vapor deposition).

Next, as shown in FIG. 11B, a portion of the TiN film 116 disposed in the N-type MOSFET region 102 is selectively removed, so as to expose the HfSiON modified layer 115 in the N-type MOSFET region 102.

Then, as shown in FIG. 11C, a polysilicon film 120 doped with an N-type impurity is formed over the semiconductor substrate 110, and then, the polysilicon film 120, the TiN film 116, the HfSiON modified layer 115, the HfSiO film 113 and the interface layer 112 are patterned. In this manner, a gate electrode 105 including the TiN film 116 and the polysilicon film 120 is formed in the P-type MOSFET region 101 above the semiconductor substrate 110 with a gate insulating film 103 including the interface layer 112, the HfSiO film 113 and the HfSiON modified layer 115 sandwiched therebetween. Also, a gate electrode 106 including the polysilicon film 120 is formed in the N-type MOSFET region 102 above the semiconductor substrate 110 with a gate insulating film 104 including the interface layer 112, the HfSiO film 113 and the HfSiON modified layer 115 sandwiched therebetween.

Thereafter, although not shown in the drawings, sidewall spacers, source/drain regions and the like are formed by known techniques, so as to complete an N-type MOSFET including the polysilicon electrode (namely, the gate electrode 106) and a P-type MOSFET including the TiN metal electrode (namely, the gate electrode 105).

SUMMARY OF THE INVENTION

In the aforementioned fabrication method for the conventional semiconductor device, however, it has been reported that the HfSiON modified layer 115 disposed below the TiN film 116 is damaged during the selective removal of the TiN film 116 in the procedure of FIG. 11B, resulting in degrading TBD (time to breakdown). Specifically, during the selective removal of the TiN film 116, a surface portion of the HfSiON modified layer 115 disposed in the N-type MOSFET region 102 is removed or bonds formed in this surface portion are broken, and hence, the nitrogen concentration may be lowered so as to degrade the leakage characteristic or the like.

In order to overcome this problem, an attempt is made to avoid the degradation of the TBD by optimizing the nitriding processing performed for forming the HfSiON modified layer 115 in Non-patent Document 1.

However, the conditions for the selective removal of a gate electrode material film are varied depending upon whether the gate electrode material film of a P-type MOSFET such as a TiN film is formed by the CVD or PVD (physical vapor deposition) or whether another metal material is used as the gate electrode material of the P-type MOSFET. Therefore, the degree of the damage of a high dielectric constant gate insulating film such as a HfSiON film is varied. Accordingly, it is difficult to stably secure the reliability of the gate insulating film merely by optimizing the nitriding processing as disclosed in Non-patent Document 1.

In consideration of this conventional problem, an object of the invention is, in a semiconductor device including a high dielectric constant film as a gate insulating film, stably securing the reliability of the gate insulating film even when a metal gate electrode is provided by using any of various materials and any of various methods.

In order to achieve the object, the semiconductor device of this invention includes a first gate electrode formed in a first region on a semiconductor substrate with a first gate insulating film sandwiched therebetween; and a second gate electrode formed in a second region on the semiconductor substrate with a second gate insulating film sandwiched therebetween, and the first gate insulating film includes a first high dielectric constant insulating film with a first nitrogen concentration, and the second gate insulating film includes a second high dielectric constant insulating film with a second nitrogen concentration higher than the first nitrogen concentration.

It is noted that a high dielectric constant insulating film (a high dielectric constant film) herein means an insulating film having a higher dielectric constant than a silicon oxide film. Also, a nitrogen concentration in a film herein means an average nitrogen concentration in the film, and when nitriding processing assumed in this invention is performed, a peak of the nitrogen concentration appears in a surface portion of the film, and as the average nitrogen concentration in the film is higher, the peak concentration is higher.

In the semiconductor device of this invention, the first high dielectric constant insulating film included in the first gate insulating film may include substantially no nitrogen. In other words, the first nitrogen concentration of the first high dielectric constant insulating film may be substantially zero.

In the semiconductor device of this invention, the second high dielectric constant insulating film may have a smaller thickness than the first high dielectric constant insulating film.

In the semiconductor device of this invention, the first gate insulating film may include a first interface layer formed between the semiconductor substrate and the first high dielectric constant insulating film, and the second gate insulating film may include a second interface layer formed between the semiconductor substrate and the second high dielectric constant insulating film. Thus, the characteristic of the interface between the semiconductor substrate and each of the gate insulating films can be improved.

In the semiconductor device of this invention, the first gate electrode may include a different conducting material from the second gate electrode. Specifically, the first gate electrode may include a first metal layer and a first silicon layer formed on the first metal layer, and the second gate electrode may include a second silicon layer. In this case, the first metal layer may be made of TiN. Alternatively, the first gate electrode may include a second metal layer formed between the first metal layer and the first silicon layer, and the second gate electrode may include a third metal layer formed between the second gate insulating film and the second silicon layer. In this case, the second metal layer and the third metal layer may be made of TaN.

In the semiconductor device of this invention, the first high dielectric constant insulating film and the second high dielectric constant insulating film may be made of HfSiON or $HfO_2$.

In the semiconductor device of this invention, the first gate electrode may be a gate electrode of a P-type MISFET, and the second gate electrode may be a gate electrode of an N-type MISFET.

The method for fabricating a semiconductor device of this invention includes the steps of (a) forming a high dielectric constant gate insulating film on a semiconductor substrate including a first region and a second region; (b) forming a first gate electrode forming conducting film on the high dielectric constant gate insulating film; (c) removing a portion of the first gate electrode forming conducting film disposed in the second region; (d) nitriding a portion of the high dielectric constant gate insulating film disposed in the second region after the step (c); and (e) forming a second gate electrode forming conducting film at least in the second region after the step (d).

In the method for fabricating a semiconductor device of this invention, $N_2$ plasma processing or annealing in a $NH_3$ atmosphere may be performed in the step (d).

The method for fabricating a semiconductor device of this invention may further include, between the step (a) and the step (b), a step (f) of nitriding the high dielectric constant gate insulating film. In this case, $N_2$ plasma processing or annealing in a $NH_3$ atmosphere may be performed in the step (f).

In the case where the method for fabricating a semiconductor device of this invention further includes the step (f) of nitriding the high dielectric constant gate insulating film between the step (a) and the step (b), the nitrogen concentration in a portion of the high dielectric constant gate insulating film disposed in the second region (namely, the second nitrogen concentration of the semiconductor device of this invention) is preferably higher than the nitrogen concentration in a portion of the high dielectric constant gate insulating film disposed in the first region (namely, the first nitrogen concentration of the semiconductor device of this invention) after the step (d). However, even when the second nitrogen concentration is equivalent to or lower than the first nitrogen concentration, an effect to improve the reliability of the gate insulating film can be attained as far as the second nitrogen concentration is higher after the step (d) as compared with that attained immediately after the step (c).

In the method for fabricating a semiconductor device of this invention, the high dielectric constant gate insulating film may have a smaller thickness in the portion disposed in the second region than in another portion thereof in the step (c).

According to the present invention, the nitriding processing is performed on the high dielectric constant gate insulating film after selective removal of the gate electrode material film. Therefore, in the case where different gate electrodes are individually formed by using different gate electrode materials for an N-type MISFET (metal-insulator-semiconductor field-effect transistor) and a P-type MISFET in a semiconductor device using a high dielectric constant gate insulating film, damage of the high dielectric constant gate insulating film caused in selective removal of a gate electrode material film can be definitely recovered. Accordingly, the reliability of the gate insulating film can be stably secured, and hence, a highly reliable semiconductor device can be easily obtained.

As described above, the present invention is applicable to a semiconductor device including a high dielectric constant film as a gate insulating film and having different gate electrode structures for an N-type MISFET and a P-type MISFET, and hence, the invention is useful for fabrication of a highly reliable system LSI.

BRIEF DESCRIPTION OF THE DRAWINGS

FIGS. 3A, 3B and 3C are cross-sectional views for showing other procedures in the method for fabricating a semiconductor device according to Embodiment 1 of the invention.

FIGS. 9A, 9B and 9C are cross-sectional views for showing still other procedures in the method for fabricating a semiconductor device according to Embodiment 2 of the invention.

DETAILED DESCRIPTION OF THE INVENTION

Embodiment 1

A semiconductor device and a method for fabricating the same according to Embodiment 1 of the invention will now be described with reference to the accompanying drawings.

Figure 1:
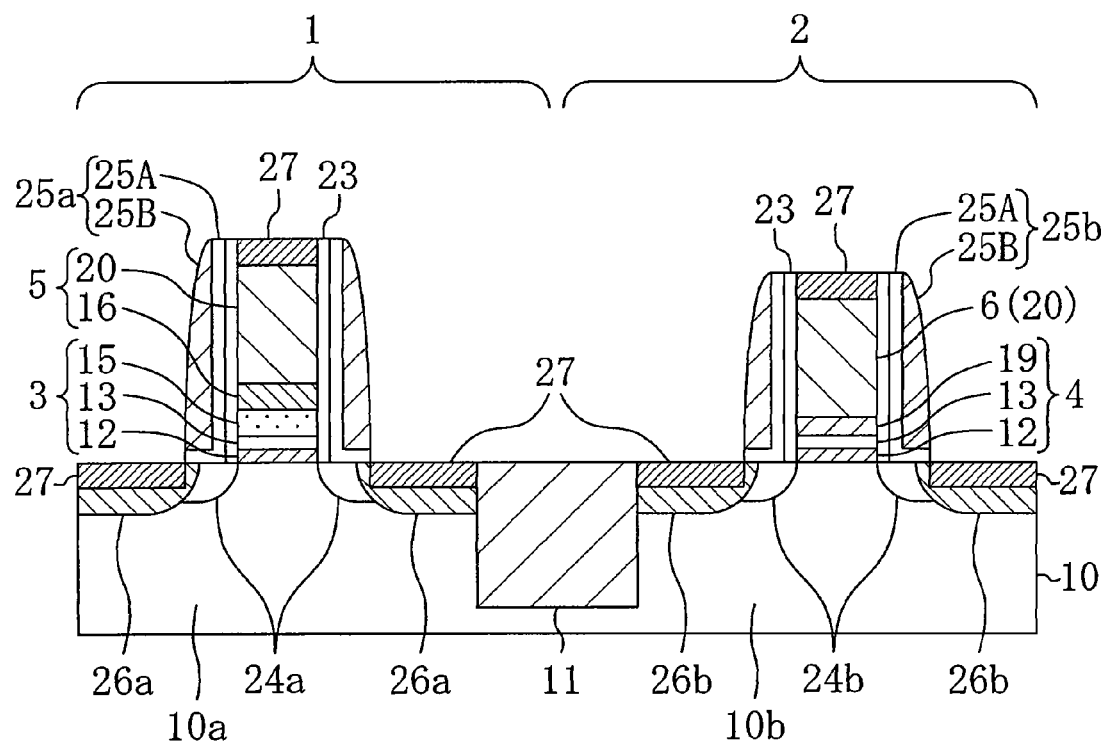
FIG. 1 is a cross-sectional view of a semiconductor device according to Embodiment 1 of the invention.

FIG. 1 is a cross-sectional view of the semiconductor device of Embodiment 1.

As shown in FIG. 1, an isolation region 11 is formed in a semiconductor substrate 10 so as to isolate an active region 10a corresponding to a portion of the semiconductor substrate 10 disposed in a P-type MISFET region 1 and an active region 10b corresponding to a portion of the semiconductor substrate 10 disposed in an N-type MISFET region 2.

In the P-type MISFET region 1, a gate electrode 5 including a TiN film 16 with a thickness of 10 nm deposited by, for example, PVD and a polysilicon film 20 doped with, for example, an N-type impurity and having a thickness of 100 nm successively stacked is formed above the active region 10a. A gate insulating film 3 including an interface layer 12 of, for example, SiON, a HfSiO film 13 and a HfSiON modified layer 15 successively stacked is disposed between the active region 10a and the gate electrode 5. The HfSiON modified layer 15 is formed by nitriding the HfSiO film 13.

In the N-type MISFET region 2, a gate electrode 6 including a polysilicon film 20 doped with, for example, an N-type impurity and having a thickness of 100 nm is formed above the active region 10b. A gate insulating film 4 including the interface layer 12 of, for example, SiON, the HfSiO film 13 and a HfSiON modified layer 19 successively stacked is disposed between the active region 10b and the gate electrode 6. The HfSiON modified layer 19 is formed by nitriding the HfSiO film 13.

P-type extension regions 24a are formed in portions of the active region 10a disposed on both sides of the gate electrode 5, and N-type extension regions 24b are formed in portions of the active region 10b disposed on both sides of the gate electrode 6. Insulating sidewall spacers 25a and 25b are respectively formed on the side faces of the gate electrodes 5 and 6 with an insulating offset spacer 23 sandwiched therebetween. Each of the insulating sidewall spacers 25a and 25b is composed of an inner spacer 25A in, for example, an L shape and an outer spacer 25B. P-type source/drain regions 26a are formed in portions of the active region 10a disposed on farther sides of the insulating sidewall spacer 25a from the gate electrode 5, and N-type source/drain regions 26b are formed in portions of the active region 10b disposed on farther sides of the insulating sidewall spacer 25b from the gate electrode 6. A Ni silicide layer 27 is formed in upper portions of the gate electrodes 5 and 6 and in surface portions of the source/drain regions 26a and 26b.

As a characteristic of this embodiment, the nitrogen concentration is higher in the HfSiON modified layer 19 included in the gate insulating film 4 of an N-type MISFET than in the HfSiON modified layer 15 included in the gate insulating film 3 of a P-type MISFET.

Now, a method for fabricating the semiconductor device of this embodiment shown in FIG. 1 will be described.

FIGS. 2A through 2C, 3A through 3C and 4A through 4C are cross-sectional views for showing procedures in the method for fabricating a semiconductor device of this embodiment.

Figure 2A:
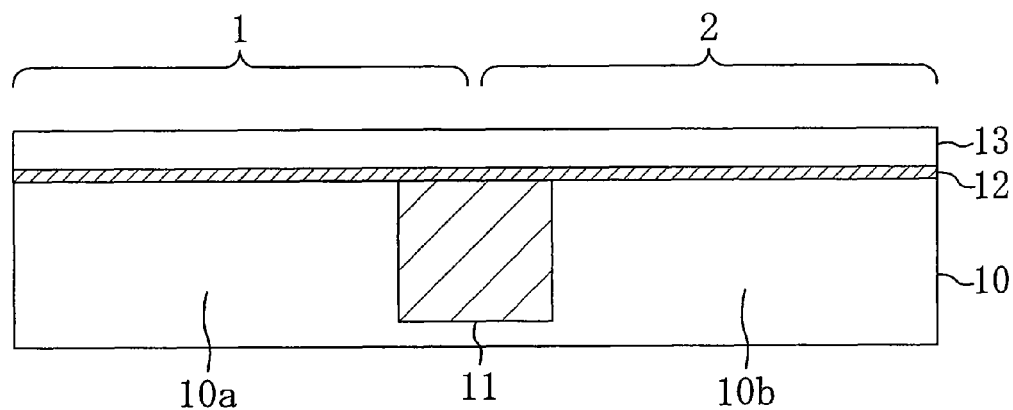
FIGS. 2A, 2B and 2C are cross-sectional views for showing procedures in a method for fabricating a semiconductor device according to Embodiment 1 of the invention.

First, as shown in FIG. 2A, an isolation region 11 is formed in a semiconductor substrate 10 by, for example, an STI (shallow trench isolation) method, so as to isolate an active region 10a corresponding to a portion of the semiconductor substrate 10 disposed in a P-type MISFET region 1 and an active region 10b corresponding to a portion of the semiconductor substrate 10 disposed in an N-type MISFET region 2. Thereafter, although not shown in the drawings, ions are implanted into the P-type MISFET region 1 and the N-type MISFET region 2 of the semiconductor substrate 10 for well formation, channel stopping, channel doping and the like. Then, an interface layer 12 made of, for example, a SiON film with a thickness of 1.6 nm is formed on the semiconductor substrate 10 including the P-type MISFET region 1 and the N-type MISFET region 2, and a HfSiO film 13 with a thickness of, for example, 2.0 nm is subsequently formed on the interface layer 12.

Figure 2B:
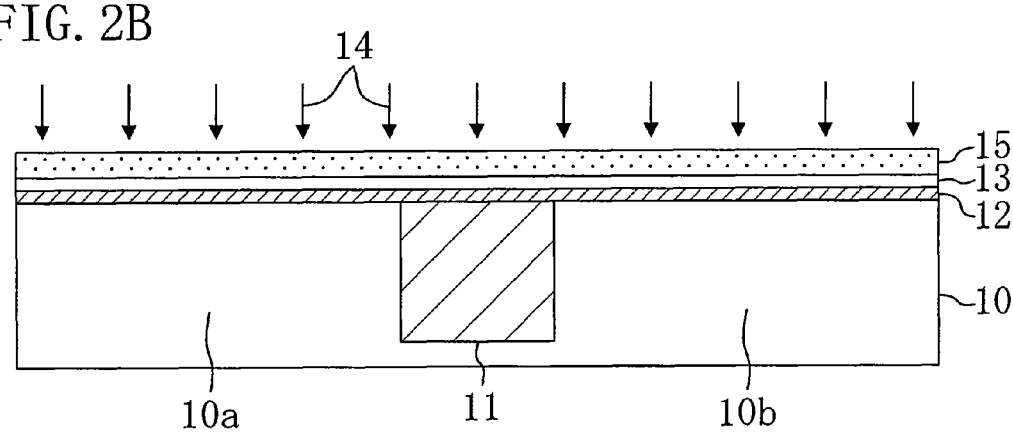

Next, as shown in FIG. 2B, nitriding processing using, for example, nitrogen ($N_2$) plasma 14 is performed on the whole top face of the HfSiO film 13 so as to form a HfSiON modified layer 15. At this point, the nitrogen concentration (the peak concentration) in the HfSiON modified layer 15 is, for example, 5 through 20 atomic %. Thereafter, in order to recover a bonding state in a surface portion of the HfSiON modified layer 15, annealing is performed at, for example, approximately 700 through 1000° C.

Although the $N_2$ plasma processing is performed in the nitriding processing in the procedure of FIG. 2B in this embodiment, another nitriding processing such as annealing in a $NH_3$ atmosphere may be performed instead. In this case, the recovering annealing performed after the nitriding processing may be omitted.

Also, in the nitriding processing shown in FIG. 2B, the HfSiON modified layer 15 is formed at least in a surface portion of the HfSiO film 13.

Figure 2C:
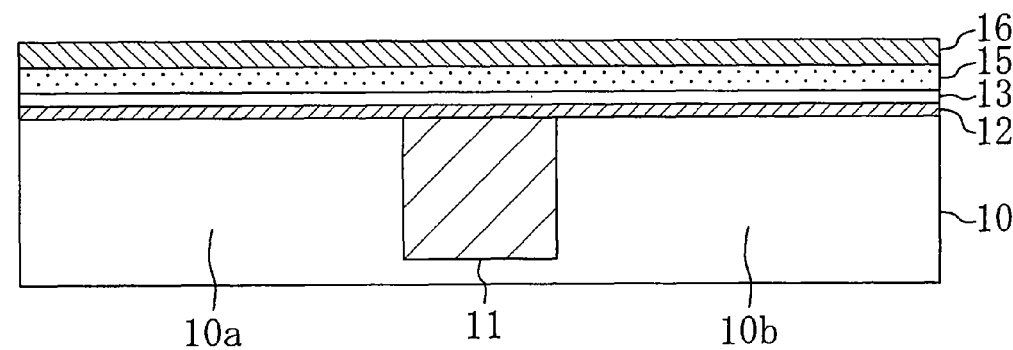

Next, as shown in FIG. 2C, a TiN film 16 with a thickness of approximately 10 nm is formed over the HfSiON modified layer 15 by, for example, the PVD.

Then, as shown in FIG. 3A, after forming a resist pattern 17 covering the P-type MISFET region 1 on the TiN film 16, wet etching using a chemical including $H_2O_2$ as a principal component is performed by using the resist pattern 17 as a mask, so as to selectively remove a portion of the TiN film 16 disposed in the N-type MISFET region 2, and thereafter, the resist pattern 17 is removed. At this point, a portion of the HfSiON modified layer 15 exposed in the N-type MISFET region 2 is slightly etched or oxidized, and hence, the nitrogen concentration in an uppermost surface portion is lowered.

When the nitrogen concentration in a surface portion of the HfSiON modified layer 15 corresponding to the interface of the gate insulating film with the gate electrode is lowered, a leakage current is increased and an electric capacitance film thickness is increased, and as a result, the performance as the gate insulating film is degraded.

Therefore, in this embodiment, the nitriding processing using nitrogen ($N_2$) plasma 18 is performed on the whole surface of the substrate as shown in FIG. 3B after the procedure of FIG. 3A, so as to form a HfSiON modified layer 19 by nitriding again the portion of the HfSiON modified layer 15 disposed in the N-type MISFET region 2. At this point, the nitrogen concentration (the peak concentration) in the HfSiON modified layer 19 is, for example, 5 through 40 atomic %. Thereafter, in order to recover a bonding state in a surface portion of the HfSiON modified layer 19, the annealing is performed at, for example, approximately 700 through 1000° C.

In this embodiment, the nitrogen concentration in the HfSiON modified layer 19 provided in the N-type MISFET region 2 is set to be preferably higher than the nitrogen concentration in the HfSiON modified layer 15 provided in the P-type MISFET region 1 by performing the nitriding processing twice on the portion of the HfSiO film 13 disposed in the N-type MISFET region 2. At this point, an effect to suppress leakage is more remarkably exhibited as the nitrogen concentration in the HfSiON modified layer 19 is higher. However, even when the nitrogen concentration in the HfSiON modified layer 19 is equivalent to or lower than that in the HfSiON modified layer 15, the effect to suppress leakage can be attained as far as the nitrogen concentration in the HfSiON modified layer 19 is higher than the nitrogen concentration in the HfSiON modified layer 15 provided in the N-type MISFET region 2 immediately after the selective removal of the TiN film 16 in the procedure of FIG. 3A.

Furthermore, although the nitriding processing of FIG. 3B is performed after removing the resist pattern 17 used in the procedure of FIG. 3A in this embodiment, the nitriding processing of FIG. 3B may be performed with the resist pattern 17 remaining so as to remove the resist pattern 17 after the nitriding processing.

Moreover, although the $N_2$ plasma processing is performed in the nitriding processing of FIG. 3B, another nitriding processing such as annealing in a $NH_3$ atmosphere may be performed instead. In this case, the recovering annealing performed after the nitriding processing may be omitted.

Furthermore, in the nitriding processing of FIG. 3B, the HfSiON modified layer 19 is formed at least in a surface portion of the HfSiO film 13. Also, a modified region obtained through this nitriding processing may reach the interface layer 12. In this case, since the nitrogen concentration on the substrate interface in the N-MISFET region 2 is high, the threshold voltage of the N-type MISFET can be lowered through fixed charge.

Next, as shown in FIG. 3C, a polysilicon film 20 doped with, for example, an N-type impurity and having a thickness of 100 nm is formed over the top face of the semiconductor substrate 10. At this point, the polysilicon film 20 is formed so as to be in contact with the top faces of the TiN film 16 and the HfSiON modified layer 19.

Figure 4A:
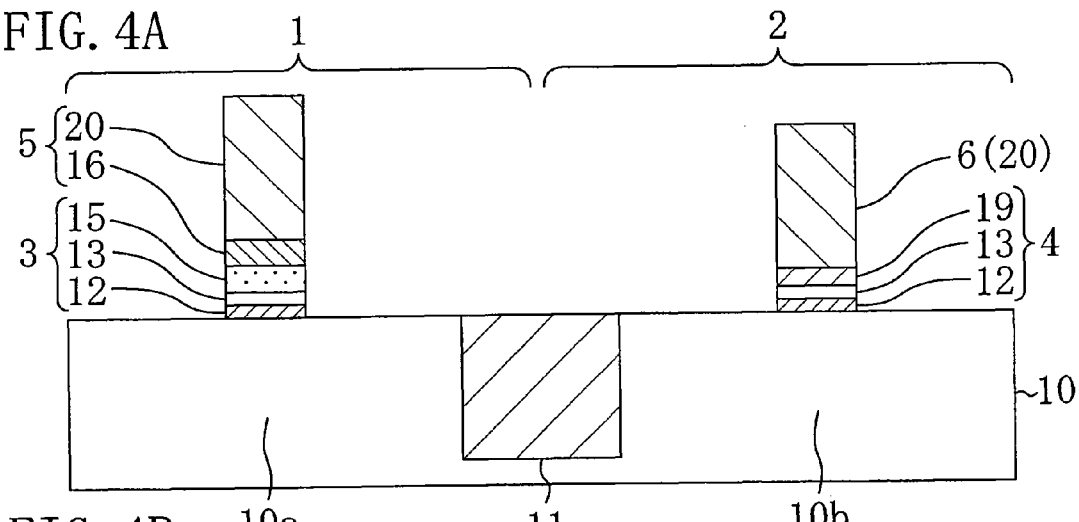
FIGS. 4A, 4B and 4C are cross-sectional views for showing still other procedures in the method for fabricating a semiconductor device according to Embodiment 1 of the invention.

Then, by using a resist pattern (not shown) in a shape of gate electrodes as a mask, the polysilicon film 20, the TiN film 16, the HfSiO film 13 including the HfSiON modified layers 15 and 19, and the interface layer 12 are successively etched for patterning as shown in FIG. 4A. Thus, a gate electrode 5 including the TiN film 16 and the polysilicon film 20 is formed above the active region 10a in the P-type MISFET region 1 with a gate insulating film 3 including the interface layer 12, the HfSiO film 13 and the HfSiON modified layer 15 sandwiched therebetween. Also, a gate electrode 6 including the polysilicon film 20 is formed above the active region 10b in the N-type MISFET region 2 with a gate insulating film 4 including the interface layer 12, the HfSiO film 13 and the HfSiON modified layer 19 sandwiched therebetween.

Figure 4B:
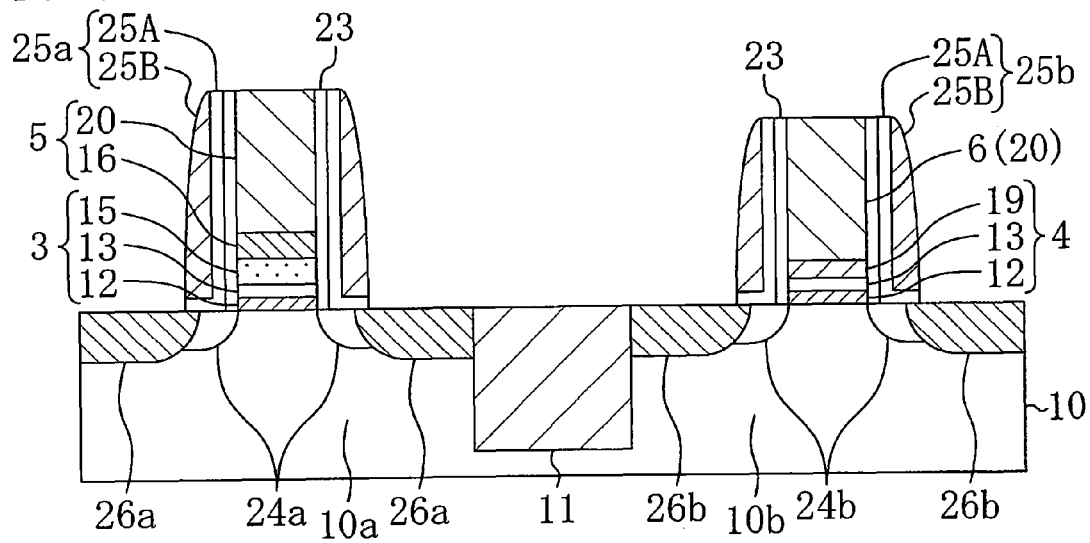

Thereafter, an insulating offset spacer 23 is formed on the side faces of the gate electrode 5 disposed in the P-type MISFET region 1 and the gate electrode 6 disposed in the N-type MISFET region 2 by known technique as shown in FIG. 4B. Then, P-type extension regions 24a are formed in portions of the active region 10a on both sides of the gate electrode 5, and N-type extension regions 24b are formed in portions of the active region 10b on both sides of the gate electrode 6. Thereafter, insulating sidewall spacers 25a and 25b each composed of an inner spacer 25A in, for example, an L shape and an outer spacer 25B are respectively formed on the side faces of the gate electrodes 5 and 6 on which the insulating offset spacer 23 is formed. Subsequently, P-type source/drain regions 26a are formed in portions of the active region 10a disposed on farther sides of the insulating sidewall spacer 25a from the gate electrode 5, and N-type source/drain regions 26b are formed in portions of the active region 10b disposed on farther sides of the insulating sidewall spacer 25b from the gate electrode 6.

Figure 4C:
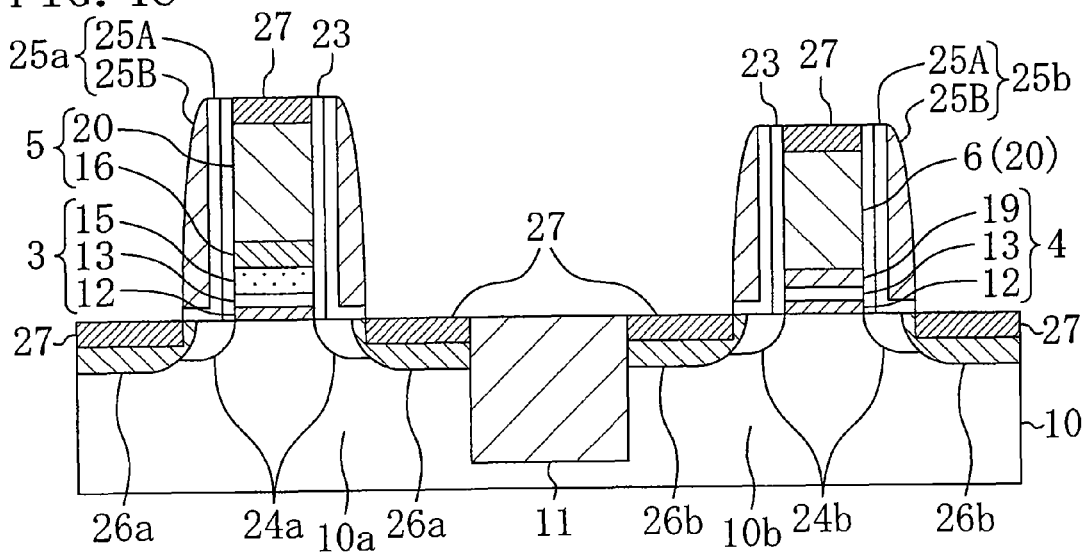

Next, as shown in FIG. 4C, a Ni silicide layer 27 is formed in surface portions of the P-type source/drain regions 26a, the N-type source/drain regions 26b and the gate electrodes 5 and 6 by what is called salicide process as shown in FIG. 4C. In this manner, a CMIS (complementary metal-insulator semiconductor) transistor including a P-MISFET and an N-MISFET having different gate electrode structures on a high dielectric constant gate insulating film including HfSiON is obtained.

As described above, according to this embodiment, the nitrogen concentration in the HfSiON film working as the gate insulating film 4 of the N-type MISFET region 2 can be increased merely by performing the nitriding processing and the annealing, if necessary, in the procedure of FIG. 3B additionally to the conventional process after the selective removal of the TiN film 16 performed in the procedure of FIG. 3A. Therefore, a highly reliable semiconductor device can be stably and easily fabricated.

In general, the NBTI (negative bias temperature instability) of a P-type MISFET is known to be degraded when the nitrogen concentration in a gate insulating film of the P-type MISFET is increased. However, since the nitrogen concentration optimum for a gate insulating film of a P-type MISFET and the nitrogen concentration optimum for a gate insulating film of an N-type MISFET can be individually set in this embodiment, even when a metal gate electrode is provided by using any of various materials and any of various methods in a semiconductor device including a high dielectric constant film as a gate insulating film, the semiconductor device can be fabricated with higher performance and higher reliability.

Although the HfSiON film is used as the high dielectric constant insulating film included in the gate insulating film 3 of the P-type MISFET region 1 and the gate insulating film 4 of the N-type MISFET region 2 in this embodiment, another high dielectric constant insulating film such as a HfAlON film or a $Y_2O_3$ film may be used instead.

Although the multilayered structure composed of the TiN film and the polysilicon film is employed for the gate electrode 5 of the P-type MISFET region 1 in this embodiment, another electrode structure such as a multilayered structure composed of, for example, a $MoO_x$ film or a TaCN film and a polysilicon film may be employed instead.

Although a single-layered structure of the polysilicon film is employed for the gate electrode 6 of the N-type MISFET region 2 in this embodiment, another electrode structure including a NiSi layer or the like may be employed instead.

Modification of Embodiment 1

A semiconductor device and a method for fabricating the same according to a modification of Embodiment 1 of the invention will now be described with reference to the accompanying drawings.

Figure 5A:
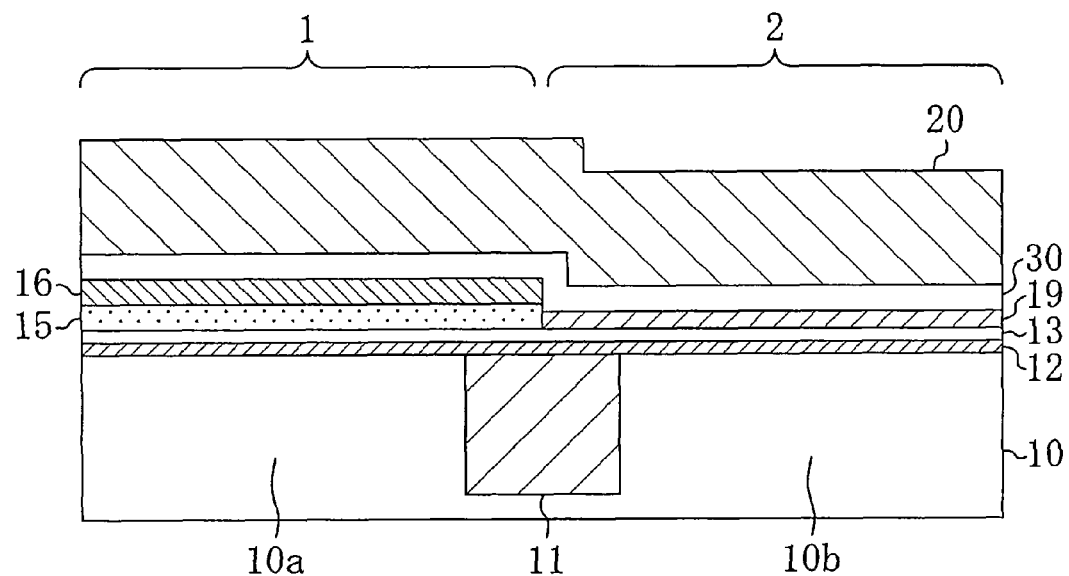
FIGS. 5A and 5B are cross-sectional views for showing procedures in a method for fabricating a semiconductor device according to a modification of Embodiment 1 of the invention.
Figure 5B:
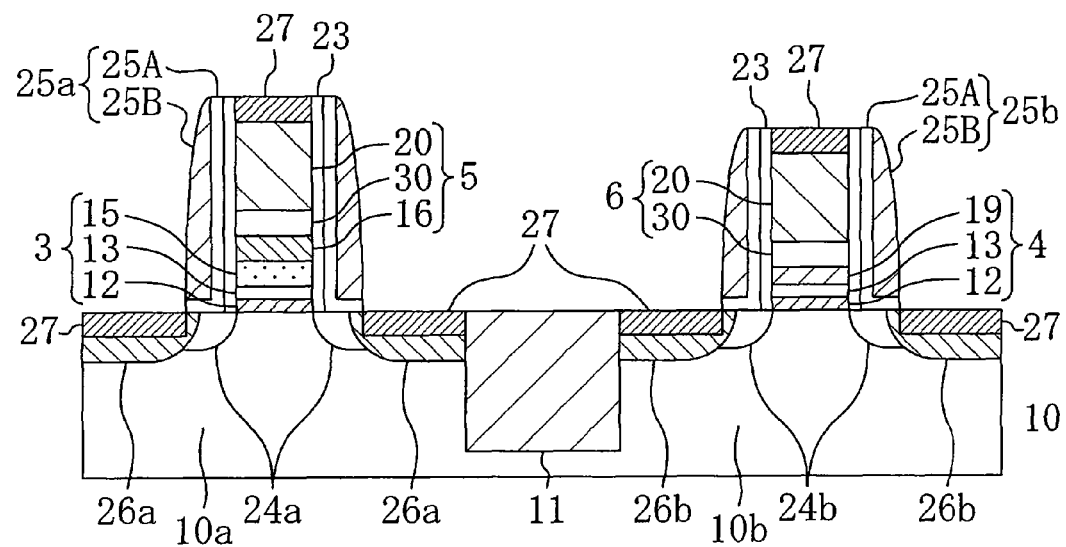

FIGS. 5A and 5B are cross-sectional views for showing procedures in the method for fabricating a semiconductor device of this modification.

This modification is different from Embodiment 1 as follows: In Embodiment 1, the polysilicon film 20 is formed over the top face of the semiconductor substrate 10 so as to be in contact with the top faces of the TiN film 16 and the HfSiON modified layer 19 in the procedure of FIG. 3C. On the contrary, in this modification, a TaN film 30 with a thickness of 10 nm is formed by, for example, the PVD over the top face of the semiconductor substrate 10 so as to be in contact with the top faces of the TiN film 16 and the HfSiON modified layer 19 as shown in FIG. 5A, and thereafter, a polysilicon film 20 doped with, for example, an N-type impurity and having a thickness of 100 nm is formed on the TaN film 30.

The other procedures of this modification are substantially the same as those of Embodiment 1. As a result, as shown in FIG. 5B, a gate electrode 5 of the P-type MISFET including the TiN film 16, the TaN film 30 and the polysilicon film 20 is formed instead of the gate electrode 5 of the P-type MISFET including the TiN film 16 and the polysilicon film 20 of Embodiment 1, and a gate electrode 6 of the N-type MISFET including the TaN film 30 and the polysilicon film 20 is formed instead of the gate electrode 6 of the N-type MISFET including the polysilicon film 20 of Embodiment 1.

According to this modification, not only the same effects as those of Embodiment 1 are attained but also an N-type MISFET free from gate depletion and exhibiting higher performance can be formed because the gate electrode of the N-type MISFET is also a metal gate electrode.

Embodiment 2

A semiconductor device and a method for fabricating the same according to Embodiment 2 of the invention will now be described with reference to the accompanying drawings.

Figure 6:
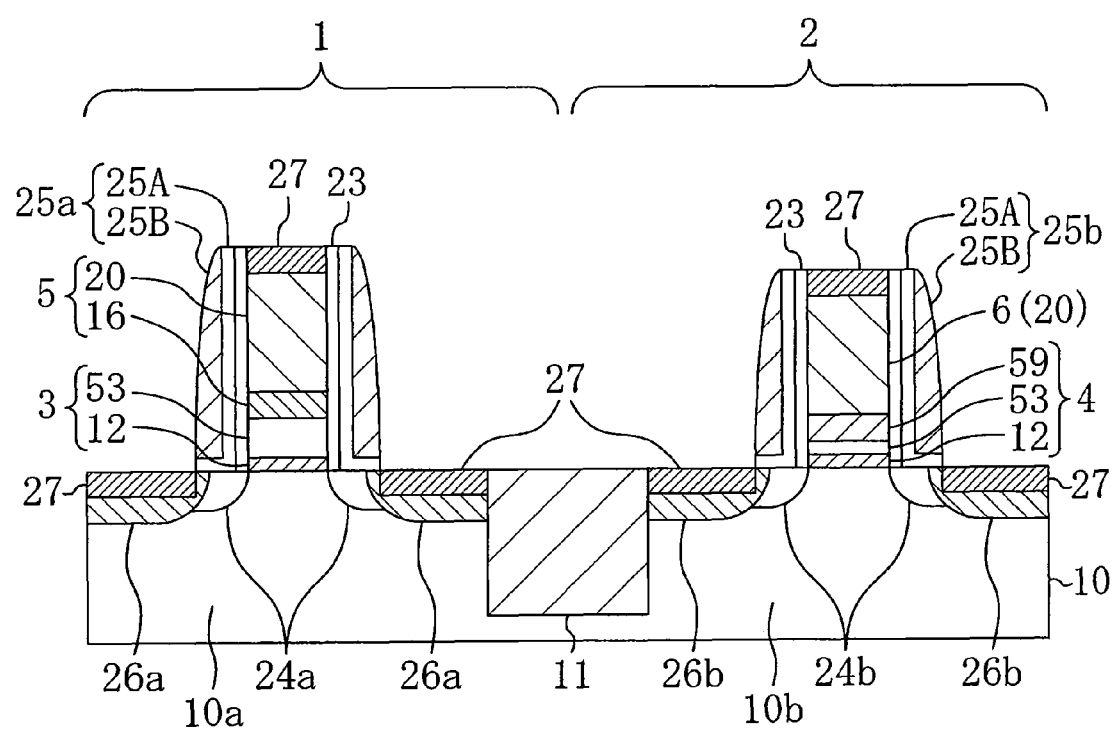
FIG. 6 is a cross-sectional view of a semiconductor device according to Embodiment 2 of the invention.

FIG. 6 is a cross-sectional view of the semiconductor device of Embodiment 2. In FIG. 6, like reference numerals are used to refer to like elements used in Embodiment 1 shown in FIG. 1.

As shown in FIG. 6, an isolation region 11 is formed in a semiconductor substrate 10, so as to isolate an active region 10a corresponding to a portion of the semiconductor substrate 10 disposed in a P-type MISFET region 1 and an active region 10b corresponding to a portion of the semiconductor substrate 10 disposed in an N-type MISFET region 2.

In the P-type MISFET region 1, a gate electrode 5 including a TiN film 16 with a thickness of 10 nm formed by, for example, the PVD and a polysilicon film 20 doped with an N-type impurity and having a thickness of 100 nm successively stacked is formed above the active region 10a. A gate insulating film 3 including an interface layer 12 of, for example, SiON and a $HfO_2$ film 53 successively stacked is disposed between the active region 10a and the gate electrode 5. The $HfO_2$ film 53 includes substantially no nitrogen.

In the N-type MISFET region 2, a gate electrode 6 including the polysilicon film 20 doped with, for example, an N-type impurity and having a thickness of 100 nm is formed above the active region 10b. A gate insulating film 4 including the interface layer 12 of, for example, SiON, the $HfO_2$ film 53 and a $HfO_2$ modified layer 59 successively stacked is disposed between the active region 10b and the gate electrode 6. The $HfO_2$ modified layer 59 is formed by nitriding the $HfO_2$ film 53.

P-type extension regions 24a are formed in portions of the active region 10a disposed on both sides of the gate electrode 5, and N-type extension regions 24b are formed in portions of the active region 10b disposed on both sides of the gate electrode 6. Insulating sidewall spacers 25a and 25b are respectively formed on the side faces of the gate electrodes 5 and 6 with an insulating offset spacer 23 sandwiched therebetween. Each of the insulating sidewall spacers 25a and 25b is composed of an inner spacer 25A in, for example, an L shape and an outer spacer 25B. P-type source/drain regions 26a are formed in portions of the active region 10a disposed on farther sides of the insulating sidewall spacer 25a from the gate electrode 5, and N-type source/drain regions 26b are formed in portions of the active region 10b disposed on farther sides of the insulating sidewall spacer 25b from the gate electrode 6. A Ni silicide layer 27 is formed in upper portions of the gate electrodes 5 and 6 and in surface portions of the source/drain regions 26a and 26b.

As a characteristic of this embodiment, the $HfO_2$ film 53 included in the gate insulating film 3 of a P-type MISFET includes substantially no nitrogen while the $HfO_2$ modified layer 59 included in the gate insulating film 4 of an N-type MISFET includes nitrogen.

Now, a method for fabricating the semiconductor device of this embodiment shown in FIG. 6 will be described.

FIGS. 7A, 7B, 8A through 8C and 9A through 9C are cross-sectional views for showing procedures in the method for fabricating a semiconductor device of this embodiment.

Figure 7A:
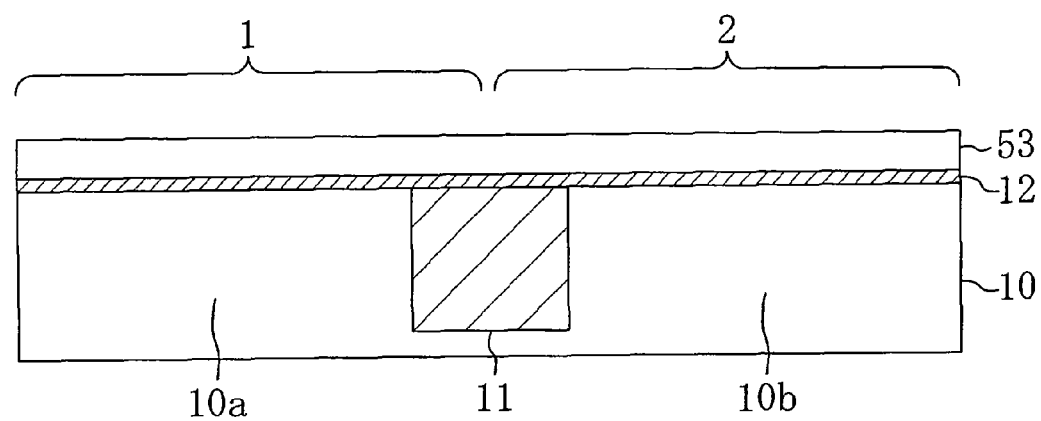
FIGS. 7A and 7B are cross-sectional views for showing procedures in a method for fabricating a semiconductor device according to Embodiment 2 of the invention.

First, as shown in FIG. 7A, an isolation region 11 is formed by, for example, the STI method in a semiconductor substrate 10, so as to isolate an active region 10a corresponding to a portion of the semiconductor substrate 10 disposed in a P-type MISFET region 1 and an active region 10b corresponding to a portion of the semiconductor substrate 10 disposed in an N-type MISFET region 2. Thereafter, although not shown in the drawings, ions are implanted into the P-type MISFET region 1 and the N-type MISFET region 2 of the semiconductor substrate 10 for well formation, channel stopping, channel doping and the like. Then, an interface layer 12 made of, for example, a SiON film with a thickness of 1.6 nm is formed on the semiconductor substrate 10 including the P-type MISFET region 1 and the N-type MISFET region 2, and a $HfO_2$ film 53 with a thickness of, for example, 2.0 nm is subsequently formed on the interface layer 12.

Figure 7B:
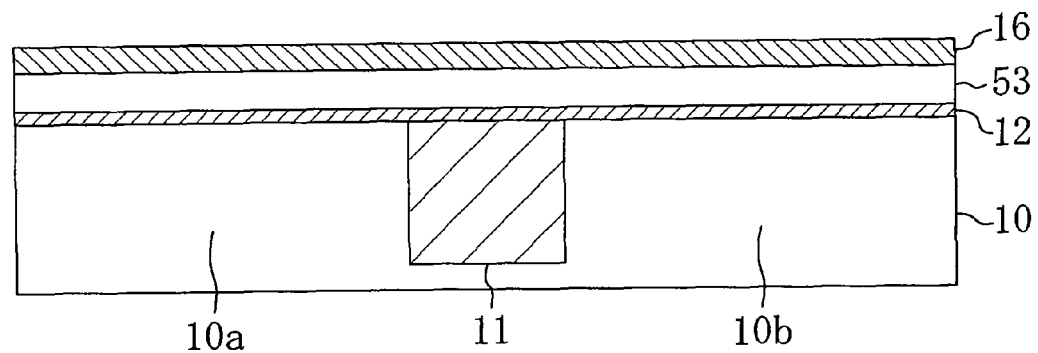

Next, as shown in FIG. 7B, a TiN film 16 with a thickness of approximately 10 nm is formed over the $HfO_2$ film 53 by, for example, the PVD.

Figure 8A:
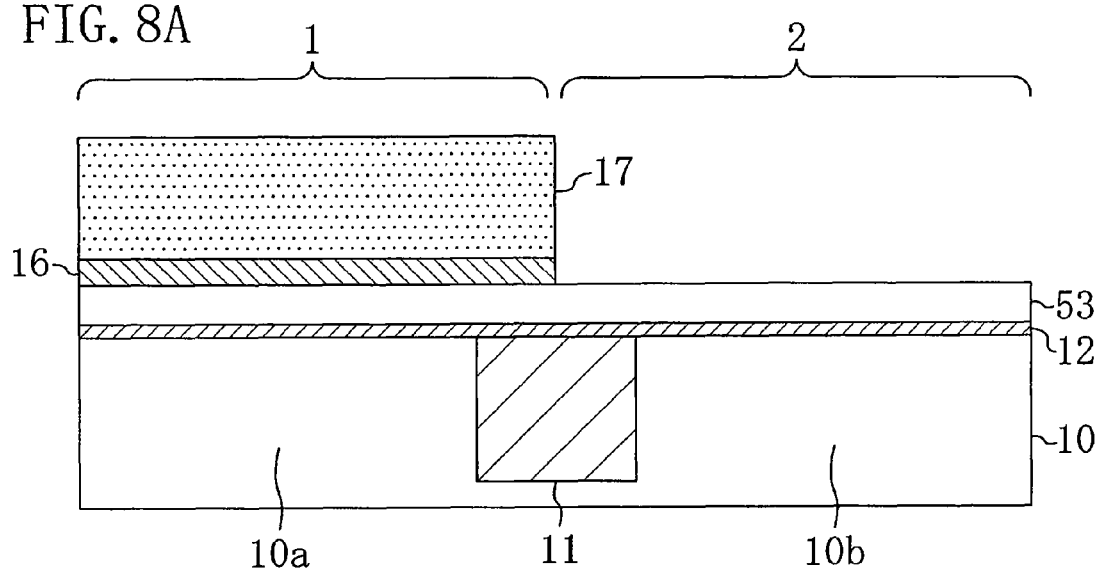
FIGS. 8A, 8B and 8C are cross-sectional views for showing other procedures in the method for fabricating a semiconductor device according to Embodiment 2 of the invention.

Then, as shown in FIG. 8A, after forming a resist pattern 17 covering the P-type MISFET region 1 on the TiN film 16, a portion of the TiN film 16 disposed in the N-type MISFET region 2 is selectively removed by the wet etching using a chemical including, for example, $H_2O_2$ as a principal component with the resist pattern 17 used as a mask, and thereafter, the resist pattern 17 is removed. At this point, a surface portion of the $HfO_2$ film 53 exposed in the N-type MISFET region 2 is damaged.

Figure 8B:
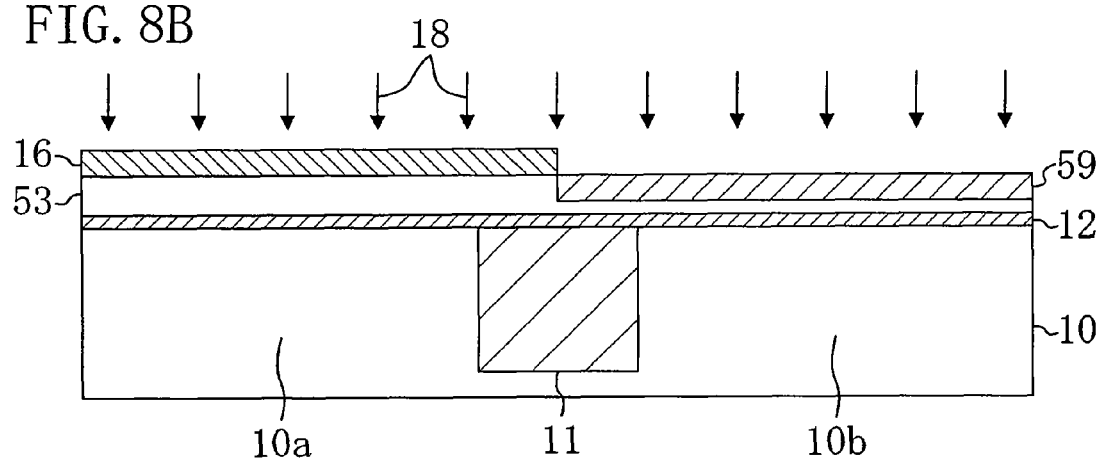

Therefore, in this embodiment, after the procedure of FIG. 8A, nitriding processing using, for example, nitrogen ($N_2$) plasma 18 is performed over the substrate as shown in FIG. 8B, so as to form a $HfO_2$ modified layer 59 by nitriding a portion of the $HfO_2$ film 53 disposed in the N-type MISFET region 2. At this point, the nitrogen concentration (the peak concentration) in the $HfO_2$ modified layer 59 is, for example, 5 through 40 atomic %. Thereafter, in order to recover a bonding state in a surface portion of the $HfO_2$ modified layer 59, the annealing is performed at, for example, approximately 700 through 1000° C.

Although the nitriding processing of FIG. 8B is performed after removing the resist pattern 17 used in the procedure of FIG. 8A in this embodiment, the nitriding processing of FIG. 8B may be performed with the resist pattern 17 remaining so as to remove the resist pattern 17 after the nitriding processing.

Moreover, although the $N_2$ plasma processing is performed in the nitriding processing of FIG. 8B, another nitriding processing such as annealing in a $NH_3$ atmosphere may be performed instead. In this case, the recovering annealing performed after the nitriding processing may be omitted.

Furthermore, in the nitriding processing of FIG. 8B, the $HfO_2$ modified layer 59 is formed at least in a surface portion of the $HfO_2$ film 53. Also, a modified region obtained through this nitriding processing may reach the interface layer 12. In this case, since the nitrogen concentration on the substrate interface in the N-MISFET region 2 is high, the threshold voltage of the N-type MISFET can be lowered through fixed charge.

Figure 8C:
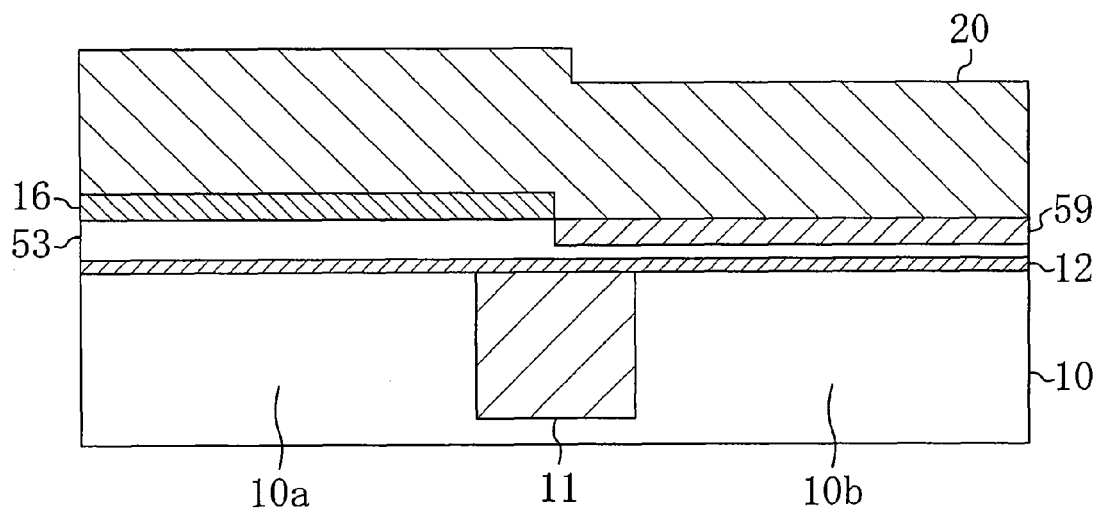

Next, as shown in FIG. 8C, a polysilicon film 20 doped with, for example, an N-type impurity and having a thickness of 100 nm is formed over the top face of the semiconductor substrate 10. At this point, the polysilicon film 20 is formed so as to be in contact with the top faces of the TiN film 16 and the $HfO_2$ modified layer 59.

Then, by using a resist pattern (not shown) in a shape of gate electrodes as a mask, the polysilicon film 20, the TiN film 16, the $HfO_2$ film 53 including the $HfO_2$ modified layer 59, and the interface layer 12 are successively etched for patterning as shown in FIG. 9A. Thus, a gate electrode 5 including the TiN film 16 and the polysilicon film 20 is formed above the active region 10a in the P-type MISFET region 1 with a gate insulating film 3 including the interface layer 12 and the $HfO_2$ film 53 sandwiched therebetween. Also, a gate electrode 6 including the polysilicon film 20 is formed above the active region 10b in the N-type MISFET region 2 with a gate insulating film 4 including the interface layer 12, the $HfO_2$ film 53 and the $HfO_2$ modified layer 59 sandwiched therebetween.

Thereafter, an insulating offset spacer 23 is formed on the side faces of the gate electrode 5 disposed in the P-type MISFET region 1 and the gate electrode 6 disposed in the N-type MISFET region 2 by known technique as shown in FIG. 9B. Then, P-type extension regions 24a are formed in portions of the active region 10a on both sides of the gate electrode 5, and N-type extension regions 24b are formed in portions of the active region 10b on both sides of the gate electrode 6. Thereafter, insulating sidewall spacers 25a and 25b each composed of an inner spacer 25A in, for example, an L shape and an outer spacer 25B are respectively formed on the side faces of the gate electrodes 5 and 6 on which the insulating offset spacer 23 is formed. Subsequently, P-type source/drain regions 26a are formed in portions of the active region 10a disposed on farther sides of the insulating sidewall spacer 25a from the gate electrode 5, and N-type source/drain regions 26b are formed in portions of the active region 10b disposed on farther sides of the insulating sidewall spacer 25b from the gate electrode 6.

Next, as shown in FIG. 9C, a Ni silicide layer 27 is formed in surface portions of the P-type source/drain regions 26a, the N-type source/drain regions 26b and the gate electrodes 5 and 6 by what is called salicide process as shown in FIG. 9C. In this manner, a CMIS transistor including a P-MISFET and an N-MISFET having different gate electrode structures on a high dielectric constant gate insulating film including $HfO_2$ is obtained.

As described above, according to this embodiment, the nitrogen concentration in the $HfO_2$ film working as the gate insulating film 4 of the N-type MISFET region 2 can be increased merely by performing the nitriding processing and the annealing, if necessary, in the procedure of FIG. 8B after the selective removal of the TiN film 16 performed in the procedure of FIG. 8A. Therefore, a highly reliable semiconductor device can be stably and easily fabricated.

Although the $HfO_2$ film is used as the high dielectric constant insulating film included in the gate insulating film 3 of the P-type MISFET region 1 and the gate insulating film 4 of the N-type MISFET region 2 in this embodiment, another high dielectric constant insulating film such as a HfAlON film or a $Y_2O_3$ film may be used instead.

Although the multilayered structure composed of the TiN film and the polysilicon film is employed for the gate electrode 5 of the P-type MISFET region 1 in this embodiment, another electrode structure such as a multilayered structure composed of a $MoO_x$ film or a TaCN film and a polysilicon film may be employed instead.

Although a single-layered structure of the polysilicon film is employed for the gate electrode 6 of the N-type MISFET region 2 in this embodiment, another electrode structure including a NiSi layer or the like may be employed instead.

Modification of Embodiment 2

A semiconductor device and a method for fabricating the same according to a modification of Embodiment 2 of the invention will now be described with reference to the accompanying drawings.

Figure 10A:
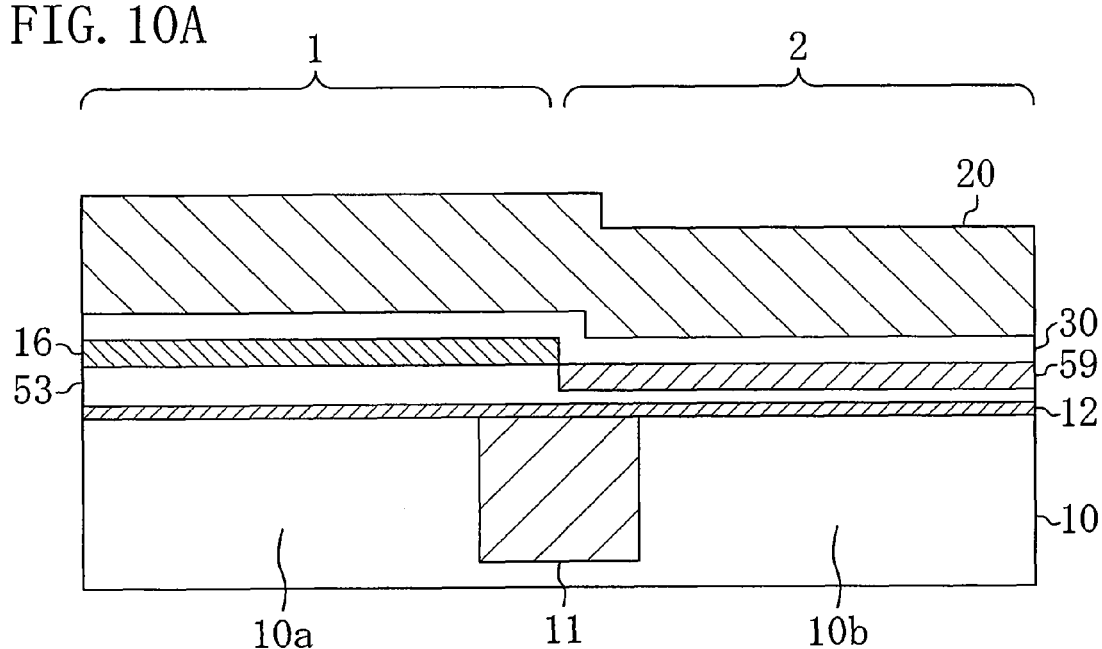
FIGS. 10A and 10B are cross-sectional views for showing procedures in a method for fabricating a semiconductor device according to a modification of Embodiment 2 of the invention.
Figure 10B:
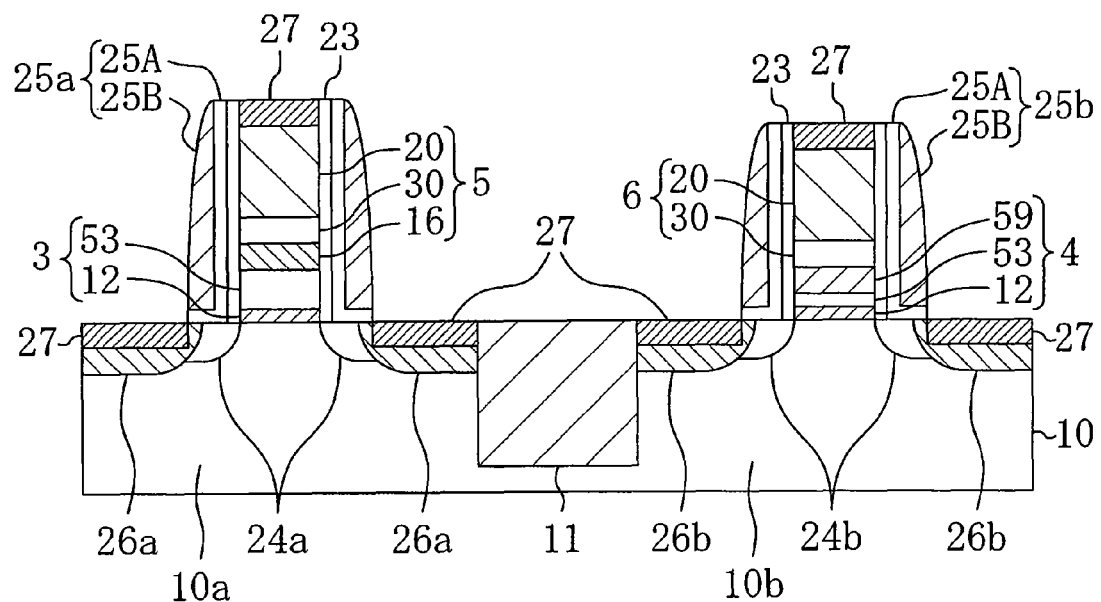
Figure 11A:
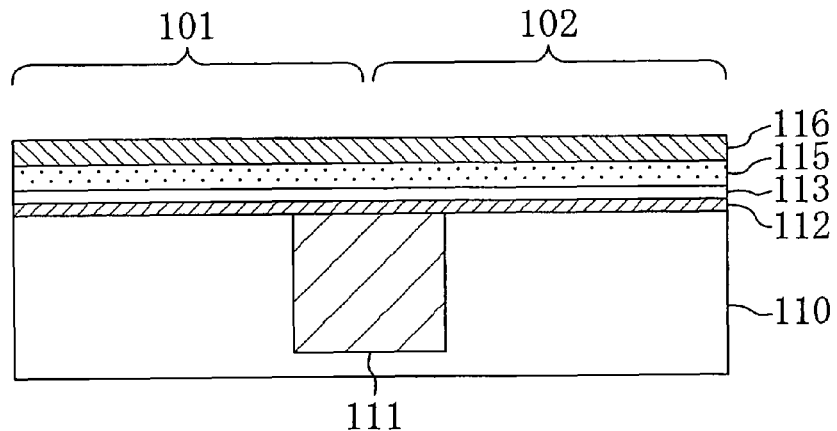
FIGS. 11A, 11B and 11C are cross-sectional views for showing procedures in a method for fabricating a conventional semiconductor device.
Figure 11B:
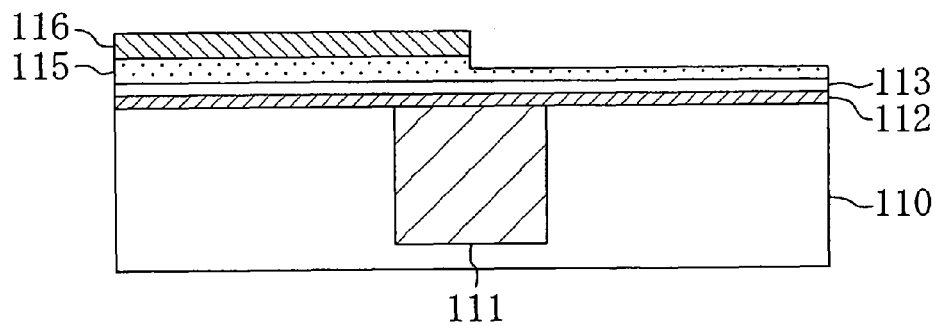
Figure 11C:
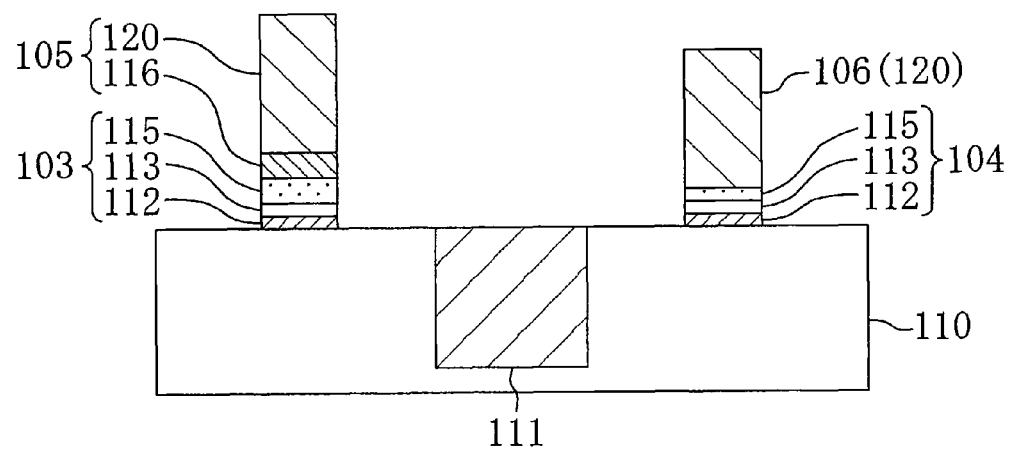

FIGS. 10A and 10B are cross-sectional views for showing procedures in the method for fabricating a semiconductor device of this modification.

This modification is different from Embodiment 2 as follows: In Embodiment 2, the polysilicon film 20 is formed over the top face of the semiconductor substrate 10 so as to be in contact with the top faces of the TiN film 16 and the $HfO_2$ modified layer 59 in the procedure of FIG. 8C. On the contrary, in this modification, a TaN film 30 with a thickness of 10 nm is formed by, for example, the PVD over the top face of the semiconductor substrate 10 so as to be in contact with the top faces of the TiN film 16 and the $HfO_2$ modified layer 59, and thereafter, a polysilicon film 20 doped with, for example, an N-type impurity and having a thickness of 100 nm is formed on the TaN film 30 as shown in FIG. 10A.

The other procedures of this modification are substantially the same as those of Embodiment 2. As a result, as shown in FIG. 10B, a gate electrode 5 of the P-type MISFET including the TiN film 16, the TaN film 30 and the polysilicon film 20 is formed instead of the gate electrode 5 of the P-type MISFET including the TiN film 16 and the polysilicon film 20 of Embodiment 2, and a gate electrode 6 of the N-type MISFET including the TaN film 30 and the polysilicon film 20 is formed instead of the gate electrode 6 of the N-type MISFET including the polysilicon film 20 of Embodiment 2.

According to this modification, not only the same effects as those of Embodiment 2 are attained but also an N-type MISFET free from gate depletion and exhibiting higher performance can be formed because the gate electrode of the N-type MISFET is also a metal gate electrode.

What is claimed is:
1. A semiconductor device comprising:
a first gate electrode formed in a first region on a semiconductor substrate with a first gate insulating film sandwiched therebetween; and
a second gate electrode formed in a second region on the semiconductor substrate with a second gate insulating film sandwiched therebetween,
the first gate insulating film including a first high dielectric constant insulating film with a first nitrogen concentration,
the second gate insulating film including a second high dielectric constant insulating film with a second nitrogen concentration higher than the first nitrogen concentration, wherein
the first gate electrode includes a first metal layer and a first silicon layer formed on the first metal layer, and
the second gate electrode includes a second silicon layer.

2. The semiconductor device of claim 1, wherein the second high dielectric constant insulating film has a smaller thickness than the first high dielectric constant insulating film.

3. The semiconductor device of claim 1,
wherein the first gate insulating film includes a first interface layer formed between the semiconductor substrate and the first high dielectric constant insulating film, and
the second gate insulating film includes a second interface layer formed between the semiconductor substrate and the second high dielectric constant insulating film.

4. The semiconductor device of claim 1, wherein the first gate electrode includes a different conducting material from the second gate electrode.

5. The semiconductor device of claim 1, wherein the first metal layer is made of TiN.

6. The semiconductor device of claim 1,
wherein the first gate electrode includes a second metal layer formed between the first metal layer and the first silicon layer, and
the second gate electrode includes a third metal layer formed between the second gate insulating film and the second silicon layer.

7. The semiconductor device of claim 6, wherein the second metal layer and the third metal layer are made of TaN.

8. The semiconductor device of claim 1, wherein the first high dielectric constant insulating film and the second high dielectric constant insulating film are made of HfSiON.

9. The semiconductor device of claim 1,
wherein the first gate electrode is a gate electrode of a P-type MISFET, and
the second gate electrode is a gate electrode of an N-type MISFET.

10. The semiconductor device of claim 1, wherein the first high dielectric constant insulating film and the second high dielectric constant insulating film are made of hafnium oxide including nitrogen.

11. The semiconductor device of claim 1, wherein the second gate electrode includes a second metal layer formed between the second gate insulating film and the second silicon layer.

12. The semiconductor device of claim 1,
wherein the first high dielectric constant insulating film includes a first HfSiO film and a first HfSiON layer formed on the first HfSiO film,
the second high dielectric constant insulating film includes a second HfSiO film and a second HfSiON layer formed on the second HfSiO film, and
a nitrogen concentration of the second HfSiON layer is higher than a nitrogen concentration of the first HfSiON layer.

13. The semiconductor device of claim 1,
wherein first extension regions of a first conductivity-type are formed in portions of the first region disposed on both sides of the first gate electrode, and
second extension regions of a second conductivity-type are formed in portions of the second region disposed on both sides of the second gate electrode.

14. The semiconductor device of claim 1, further comprising:
a first silicide layer formed on the first gate electrode; and
a second silicide layer formed on the second gate electrode.

15. The semiconductor device of claim 1, wherein a peak of the first nitrogen concentration in the first high dielectric constant insulating film is 5 through 20 atomic %.

16. The semiconductor device of claim 1, wherein a peak of the second nitrogen concentration in the second high dielectric constant insulating film is 5 through 40 atomic %.

17. The semiconductor device of claim 1, further comprising:
first insulating sidewall spacers formed on the side faces of the first gate electrode; and
second insulating sidewall spacers formed on the side faces of the second gate electrode,
wherein each of the first insulating sidewall spacers is composed of a first inner spacer in an L shape and a first outer spacer, and
each of the second insulating sidewall spacers is composed of a second inner spacer in an L shape and a second outer spacer.

18. The semiconductor device of claim 17,
wherein each of the first insulating sidewall spacers is formed on the side faces of the first gate electrode with an first insulating offset spacer sandwiched therebetween, and
each of the second insulating sidewall spacers is formed on the side faces of the second gate electrode with an second insulating offset spacer sandwiched therebetween.

19. The semiconductor device of claim 3, wherein the first interface layer and the second interface layer are made of SiON.

20. The semiconductor device of claim 1, further comprising:
a first modified layer formed in a surface portion of the first high dielectric constant insulating film; and
a second modified layer formed in a surface portion of the second high dielectric constant insulating film,
wherein the first modified layer and the second modified layer include nitrogen, and a nitrogen concentration of the second modified layer is higher than a nitrogen concentration of the first modified layer.

* * * * *